US011410713B2

(12) United States Patent
Wu et al.

(10) Patent No.: US 11,410,713 B2
(45) Date of Patent: Aug. 9, 2022

(54) APPARATUSES AND METHODS FOR DETECTING ILLEGAL COMMANDS AND COMMAND SEQUENCES

(71) Applicant: MICRON TECHNOLOGY, INC., Boise, ID (US)

(72) Inventors: Di Wu, Boise, ID (US); Debra M. Bell, Boise, ID (US); Anthony D. Veches, Boise, ID (US); James S. Rehmeyer, Boise, ID (US); Libo Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/840,946

(22) Filed: Apr. 6, 2020

(65) Prior Publication Data

US 2021/0312961 A1     Oct. 7, 2021

(51) Int. Cl.
   *G11C 7/22*      (2006.01)
   *G11C 7/10*      (2006.01)
   *G11C 8/10*      (2006.01)
   *G11C 11/4096*   (2006.01)
   *G11C 11/4076*   (2006.01)
   *G11C 11/406*    (2006.01)

(52) U.S. Cl.
   CPC .............. *G11C 7/22* (2013.01); *G11C 7/1045* (2013.01); *G11C 7/1051* (2013.01); *G11C 7/1078* (2013.01); *G11C 8/10* (2013.01); *G11C 11/4076* (2013.01); *G11C 11/4096* (2013.01); *G11C 11/40603* (2013.01)

(58) Field of Classification Search
   CPC ....... G11C 7/22; G11C 7/1045; G11C 7/1051; G11C 7/1078; G11C 8/10; G06F 21/52; G06F 21/79; G06F 13/126; G06F 13/28; G06F 13/124; G06F 13/4291; G06F 13/1631; G06F 13/4234; G06F 13/16
   See application file for complete search history.

(56) References Cited

U.S. PATENT DOCUMENTS

| | | | | |
|---|---|---|---|---|
| 6,052,806 A | * | 4/2000 | Beat ..................... | G06F 11/27 714/E11.169 |
| 6,307,779 B1 | * | 10/2001 | Roohparvar .......... | G11C 7/1072 365/185.11 |
| 6,654,848 B1 | * | 11/2003 | Cleveland ............. | G11C 16/10 365/185.33 |
| 2007/0245036 A1 | * | 10/2007 | Fekih-Romdhane .. | G11C 7/109 710/5 |

(Continued)

OTHER PUBLICATIONS

ISR/WO dated Jul. 9, 2021 for PCT Appl. No. PCT/US2021/023700, pp. all.

(Continued)

*Primary Examiner* — Mushfique Siddique
(74) *Attorney, Agent, or Firm* — Dorsey & Whitney LLP

(57) ABSTRACT

Tracking circuitry may be used to determine if commands and/or command sequences include illegal commands and/or illegal command sequences. If the commands and/or command sequences include illegal commands and/or illegal command sequences, the tracking circuitry may activate signals that prevent execution of the commands and/or notice of the detected illegal commands and/or command sequences.

16 Claims, 5 Drawing Sheets

(56) References Cited

U.S. PATENT DOCUMENTS

| | | | |
|---|---|---|---|
| 2015/0100838 A1* | 4/2015 | Baek | G11C 29/56004 |
| | | | 714/719 |
| 2017/0011790 A1 | 1/2017 | Juvekar et al. | |
| 2017/0109527 A1 | 4/2017 | Kim et al. | |
| 2019/0073261 A1 | 3/2019 | Halbert et al. | |
| 2019/0096472 A1 | 3/2019 | Kang et al. | |
| 2020/0034046 A1 | 1/2020 | Shallal et al. | |
| 2020/0073583 A1* | 3/2020 | Hwang | G06F 3/0655 |
| 2020/0226079 A1* | 7/2020 | Shallal | G06F 13/4282 |
| 2020/0257460 A1* | 8/2020 | Som | G06F 13/1668 |
| 2020/0286544 A1* | 9/2020 | Shin | G11C 7/1045 |

OTHER PUBLICATIONS

PCT Patent Application PCT/US21/23700 tilted "Apparatuses and Methods for Command/Address Tracking" filed Mar. 23, 2021, pp. all.

* cited by examiner

APPARATUSES AND METHODS FOR DETECTING ILLEGAL COMMANDS AND COMMAND SEQUENCES

BACKGROUND

This disclosure relates generally to memory devices, including volatile memory, such as dynamic random access memory (DRAM). Data may be stored in individual memory cells of the DRAM. The memory cells may be organized in an array of rows and columns. Each memory cell in a row may be coupled to a word line and each memory cell in a column may be coupled to a bit line. Thus, every memory cell may be coupled to a word line and a bit line.

In addition to security vulnerabilities in software, hackers may exploit security vulnerabilities in hardware. For example, hackers are known to repeatedly access one or more rows in DRAM (referred to as a row hammer attack) which may cause degradation of data stored on one or more rows in the vicinity of the hammered row. The degradation of the data may cause an error state that allows the hacker access to the memory and/or a computing system that includes the memory. Accordingly, detecting and preventing damage from hardware attacks may be desirable.

BRIEF SUMMARY OF THE INVENTION

The apparatuses, memories, and methods disclosed herein may allow for detection of illegal commands and/or command sequences in some embodiments. In some embodiments, the apparatuses and methods disclosure herein may prevent the execution of illegal commands and/or command sequences. In some embodiments, the apparatuses and methods disclosed herein may allow for modification of the illegal commands and/or command sequences. In some embodiments, the apparatuses and methods disclosed herein may allow for notification of the receipt of illegal commands and/or command sequences and/or allow for command data to be provided.

According to at least one example of the present disclosure, an apparatus may include a command sequence generator configured to receive and store commands and provide a command sequence including at least one command, pattern matching circuitry configured to receive the command sequence and compare the command sequence to a pattern and generate a result, wherein the result indicates whether or not the pattern is included in the command sequence, wherein the pattern corresponds to one or more commands, and a count comparator configured to receive the result, and when the result indicates the pattern is included in the command sequence, the count comparator is further configured to update a count value associated with the command sequence including the pattern and compare the count value to a threshold value.

According to at least one example of the present disclosure, a memory may include a command decoder configured to decode commands received from a memory controller, and circuitry configured to receive the commands and analyze the commands to determine if the commands include at least one of an illegal command or illegal command sequence, wherein when the circuitry determines the commands include at least one of the illegal command or the illegal command sequence, the circuitry is further configured to provide an active stop command signal to the command decoder, wherein the command decoder is configured to prevent execution of the illegal command or command sequence responsive to the active stop command signal.

According to at least one example of the present disclosure, a method may include receiving from a memory controller a command sequence including at least one command, comparing the command sequence to a pattern that corresponds to an illegal command sequence including at least one illegal command, incrementing a count associated with the command sequence and comparing the count to a threshold value when a result indicates the command sequence includes the pattern, and issuing a signal configured to prevent execution of the command sequence when the count is equal to or greater than the threshold value.

DETAILED DESCRIPTION

Figure 1:
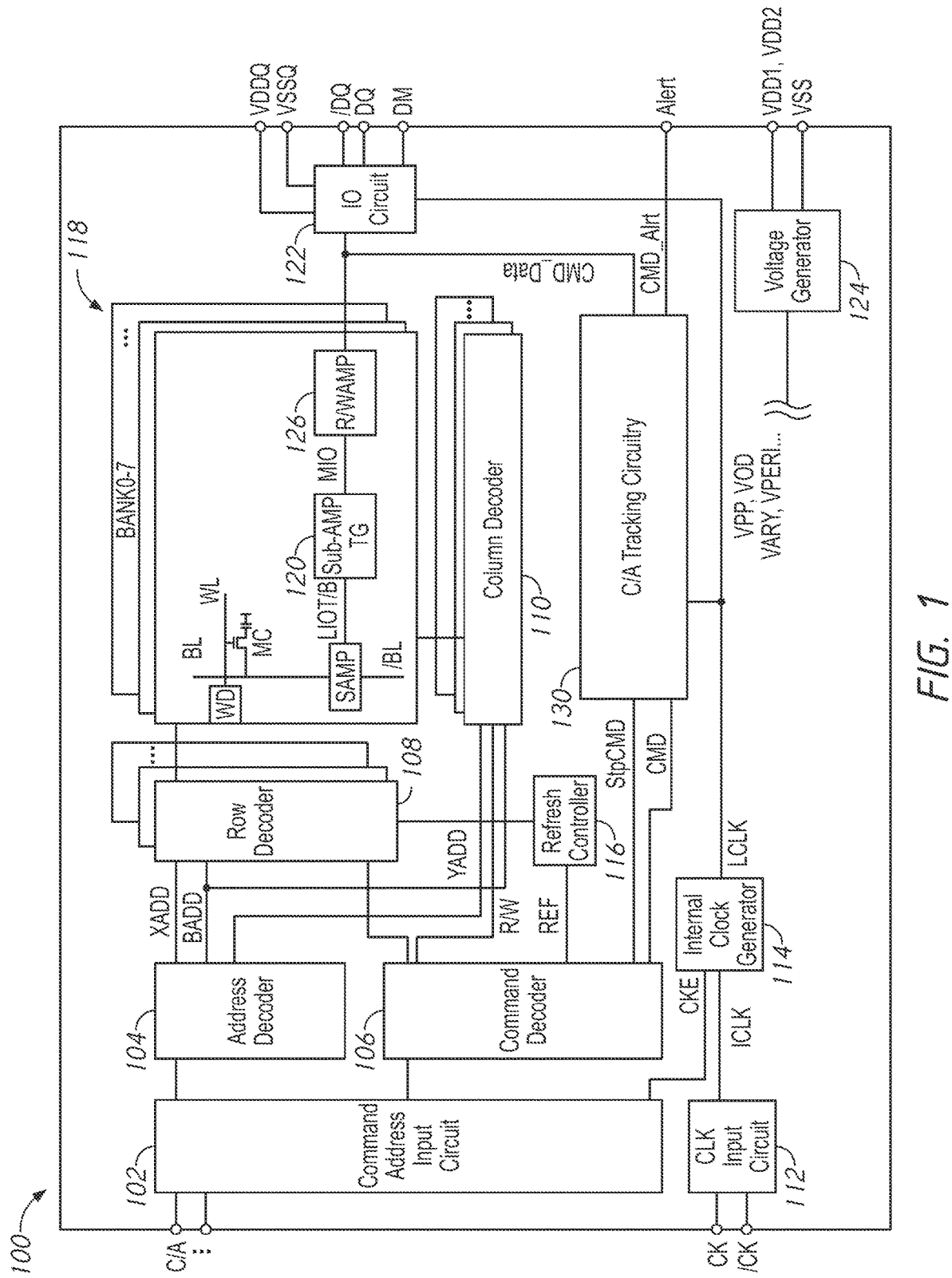
FIG. 1 is a block diagram of a semiconductor device according to embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Hackers may exploit security vulnerabilities in hardware devices, such as memory devices (e.g., flash, DRAM). In a row hammer attack, hackers may repeatedly access a row or group of rows in the memory which may cause data degradation in surrounding rows. Some memories may track the row addresses associated with access commands to detect row hammer attacks and increase the refresh rate of the surrounding rows to preserve the data. In addition or alternatively to attacks based on memory addresses, hackers may attack the memory based on particular commands and/or sequences of commands that may or may not have a memory address associated with the commands.

For example, a post package repair (PPR) command may be used to repair one or more defective rows in the memory by blowing one or more fuses and/or antifuses to remap the row addresses to other auxiliary rows. This may allow a memory with defective rows to continue to be used without the detective rows. However, the PPR command may also be exploited by hackers. Issuing the PPR command causes the memory to turn on one or more charge pumps that provide high voltages to the memory. These high voltages are used to blow the fuses and/or antifuses to repair the memory. However, the memory is subject to the high voltages when the PPR command is issued regardless of whether or not fuses and/or antifuses are blown. Prolonged exposure to the high voltages, due to remaining in the PPR state or by repeatedly issuing the PPR command, could damage components on the memory and leave the memory, and/or a system including the memory, inoperable and/or vulnerable to a breach.

In another example, refresh commands may be repeatedly issued. While refresh operations are routinely performed by the memory, repeated manual issuing of refresh commands may cause a thermal runaway condition in the memory, which may again cause damage and leave the memory and/or system inoperable and/or vulnerable.

A sequence of commands may be used to disable and/or damage the memory. For example, during a calibration operation responsive to a calibration command, executing another command (e.g., a refresh command) may interfere with the calibration. The memory may be damaged and/or inoperable due to the execution of the other command during calibration. Thus, a sequence including a calibration command followed by another command may be used as an attack on the memory. Such a sequence may also inadvertently be issued by a legitimate user, perhaps due to a programming error in the user's software.

Commands or sequences of commands that may damage the memory are referred to herein as "illegal commands" or "illegal command sequences." Of course, it is understood that some "illegal" commands may only be illegal if issued too many times or too many, times within a time interval (e.g., PPR commands); however, these potentially illegal commands and sequences are also referred to as illegal herein. Whether illegal commands are issued intentionally or inadvertently, it may be desirable to detect when illegal commands and/or command sequences are issued to a memory and prevent execution of the commands.

According to embodiments of the present disclosure, tracking circuitry may be included in a memory to monitor commands and detect and/or prevent execution of illegal commands and/or illegal command sequences. In some embodiments, the tracking circuitry, may receive and store commands and compare the commands and/or sequence of commands to one or more patterns corresponding to illegal commands and/or command sequences.

When the comparison indicates an illegal command and/or command sequence has been detected, in some embodiments, the tracking circuitry may activate a signal to prevent execution of the illegal command and/or activate a signal to provide notice of the illegal command. In some embodiments, the tracking circuitry may keep counts of how many times illegal commands and/or illegal command sequences are received (either ever or within a time interval). In these embodiments, the tracking circuitry may only activate the signals when the counts equal or exceed threshold values associated with the illegal commands and/or illegal command sequences.

FIG. 1 is a block diagram showing an overall configuration of a semiconductor device 100 according to at least one embodiment of the disclosure. The semiconductor device 100 may be a semiconductor memory device, such as a DRAM device integrated on a single semiconductor chip in some examples.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 in other embodiments. Although FIG. 1 illustrates only one memory array 118, it is understood that the device 100 may include multiple memory arrays 118 in other embodiments. Each memory bank includes a plurality of word lines WL, a plurality of bit lines BL and /BL, and a plurality of memory, cells MC arranged at intersections of the plurality of word lines WL and the plurality of bit lines BL and /BL. The selection of the word line WL is performed by a row decoder 108 and the selection of the bit lines BL and /BL is performed by a column decoder 110. A selected word line WL may be driven to a desired charge by word line driver WD. In the embodiment of FIG. 1, the row decoder 108 includes a respective row decoder for each memory bank and the column decoder 110 includes a respective column decoder for each memory bank. The bit lines BL and /BL are coupled to a respective sense amplifier (SAMP).

Read data from the bit line BL or /BL, is amplified by the sense amplifier SAMP, and provided to sub-amplifier transfer gate 120 over complementary local data lines (LIOT/B). The sub-amplifier transfer gate 120 may act as a switch to form a conductive path between the appropriate LIOT/B and appropriate shared main data lines (MIO). Read data may pass from the local data lines LIOT/B to the main data lines MIO via a conductive path provided by the sub-amplifier transfer gate 120 to a read amplifier 126, which provides the data to an IO circuit 122. Write data received from IO circuit 122 is output from a write amplifier 126 and provided to the sense amplifier SAMP over the complementary main data lines MIO, the sub-amp transfer gate 120, and the complementary local data lines LIOT/B, and written in the memory cell MC coupled to the bit line BL or /BL.

The semiconductor device 100 may employ a plurality of external terminals for transmitting and receiving information from devices external to semiconductor device 100 (e.g., outside the memory), such as a memory controller (not shown in FIG. 1). The external terminals may include command and address (C/A) terminals coupled to a command and address bus to receive commands and addresses, and a CS signal, clock terminals to receive clocks CK and /CK, data terminals DQ to provide data, an alert pin ALERT for providing an Alrt signal, and power supply terminals to receive power supply potentials VDD1, VDD2, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are provided, via a command/address input circuit 102, to an address decoder 104. The address decoder 104 receives the address and supplies a decoded row address XADD to the row decoder 108 and supplies a decoded column address YARD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line WL and a column command signal to select a bit line BL.

The device 100 may receive an access command which is a read command. When an activation command is received, and row and bank addresses are timely suppled with the activation command, followed by a read command and a column address is timely supplied with the read command, read data is read from memory cells MC in the memory array 118 corresponding to the row address and column address. The read command is received by the command decoder 106 (e.g., command controller), which provides internal commands so that read data from the memory array 118 is provided to the read amplifier 128. The read data is output to outside from the data terminals DQ via the input/output circuit 122.

The device 100 may receive an access command which is a write command. When an activation command is received, and row and bank addresses are timely suppled with the activation command, followed by a write command and a column address is timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the write amplifier 126, and by the write amplifier 126 to the memory array 118 to be written into the memory cell MC.

The device 100 may also receive commands causing it to carry out a refresh operation. The refresh signal REF may be a pulse signal which is activated when the command decoder 106 receives a signal which indicates an auto-refresh and/or other refresh command. In some embodiments, the refresh command may be externally issued to the memory device 100. In some embodiments, the refresh command may be periodically generated by a component of the device 100. The refresh signal REF is provided to a refresh control circuit 116 (e.g., refresh controller). A refresh command provided to the refresh control circuit 116 may cause the device 100 to carry out refresh operations for one or more of the memory banks.

The refresh control circuit 116 supplies a refresh row address RXADD to the row decoder circuit 108, which may refresh one or more word lines WL indicated by the refresh row address. The refresh control circuit 116 may control a timing of the refresh operation based on the refresh signal. Responsive to an activation of the refresh signal, the refresh control circuit 116 may generate and provide one or more refresh addresses.

One type of refresh operation may be an auto-refresh operation. Responsive to an auto-refresh operation the device 100 may refresh a word line or a group of word lines of the memory array 118, and then may refresh a next word line or group of word lines of the memory responsive to a next auto-refresh operation. The refresh control circuit 116 may provide an auto-refresh address as the refresh address which indicates a word line or a group of word lines in the memory array 118. The refresh control circuit 116 may generate a sequence of refresh addresses such that over time the auto-refresh operation may cycle through all the word lines of the memory array 118.

According to embodiments of the present disclosure, device 100 may include C/A tracking circuitry 130 (also referred to as tracking circuitry). In some embodiments, the command decoder 106 may provide memory commands received CMD to the tracking circuitry 130. The tracking circuitry 130 may monitor the commands CMD to determine whether or not device 100 has received an illegal command and/or illegal command sequence. If the tracking circuitry 130 detects an illegal command and/or sequence, the tracking circuitry 130 may provide an active stop command signal StpCMD to the command decoder 106. An active StpCMD may cause the command decoder 106 to refrain from issuing the illegal commands to other components of device 100 and/or issue additional commands to prevent execution of the illegal commands. In some embodiments, the command decoder 106 may modify the illegal commands such that non-illegal commands are executed. For example, if a refresh command is issued before a required latency period has elapsed after a calibration command, responsive to the active StpCMD, the command decoder 106 may modify the command sequence such that the required latency period elapses before issuing the refresh command.

In some embodiments, the tracking circuitry 130 may provide a command alert signal CMD_Alrt to an alert pin of device 100. The tracking circuitry 130 may provide an active CMD_Alert when an illegal command and/or sequence is detected. The CMD_Alert signal may be used to generate a warning, error message, and/or other notification to a user or another device (not shown) in communication with the device 100. In some embodiments, the CMD_Alert signal may notify the user and/or other device that a command or command was detected, not executed and/or modified. In some embodiments, the tracking circuitry 130 may store data relating to commands CMD received (e.g., command data). Example command data may include, but is not limited to, a number of times a command was received, a number of times within a time interval a command was received, when a command was received, and/or a combination thereof. In some embodiments, the command data CMD_Data may be provided by the tracking circuitry 130 to IO circuit 122, for example, responsive to a command data read command.

In some embodiments, the tracking circuitry 130 may receive internal clock signal LCLK from the internal clock generator 114. The LCLK may be used for timing of monitoring operations of the tracking circuitry 130. For example, in some embodiments, the LCKL may be used to determine a number of times a command is received during a time interval.

In some embodiments, tracking circuitry 130 may receive addresses from address decoder 104 (not shown). Addresses may be used to detect illegal commands when whether or not a command is illegal may depend on an address associated with the command. In some embodiments, tracking circuitry 130 may receive commands and/or addresses from the command address input circuit 102 in addition to and/or instead of the command decoder 106 and/or address decoder 104. In some embodiments, tracking circuitry 130 may provide StpCMD to the command address input circuit 102 in addition to and/or instead of the command decoder 106.

In some embodiments, the tracking circuitry 130 may form an integral part of the device 100. For example, the tracking circuitry 130 may be formed in a same semiconductor die as the memory array 118. In some examples, the tracking circuitry 130 may be on a same printed circuit board as the memory array 118.

Power supply terminals of device 100 are supplied with power supply potentials VDD1, VDD2, and VSS. The power supply potentials VDD1, VDD2, and VSS are supplied to an internal voltage generator circuit 124. The internal voltage generator circuit 124 generates various internal potentials VPP, VOD, VARY, \TERI, and the like based on the power supply potentials VDD1, VDD2, and VSS supplied to the power supply terminals. While the various internal potentials and power supply potentials may be used for any of the different circuits of the device 100, the internal potential VPP is mainly used in the row decoder 108, the internal potentials VOD and VARY are mainly used in the sense amplifiers SAMP included in the memory array 118, and the internal potential VPER1 is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

The components of semiconductor device 100 (e.g., command decoder 106, C/A tracking circuitry 130) may transmit and/or receive information with other components of semiconductor device 100 without accessing the external terminals (e.g., C/A, DQ). In some embodiments, the components may be coupled to one another by conductive traces for transmitting and/or receiving information (e.g., the CMD line, StpCMD line, XADD line). Components that can communicate with other components of semiconductor device 100 without accessing the external terminals may be considered on semiconductor device 100 (e.g., "on memory" or "of the memory" when semiconductor device 100 is a memory device) and other components or devices that must access the external terminals of semiconductor device 100 to communicate with components of semiconductor device 100 may be considered off and/or outside semiconductor device 100 (e. "off memory" when semiconductor device 100 is a memory device).

Figure 2:
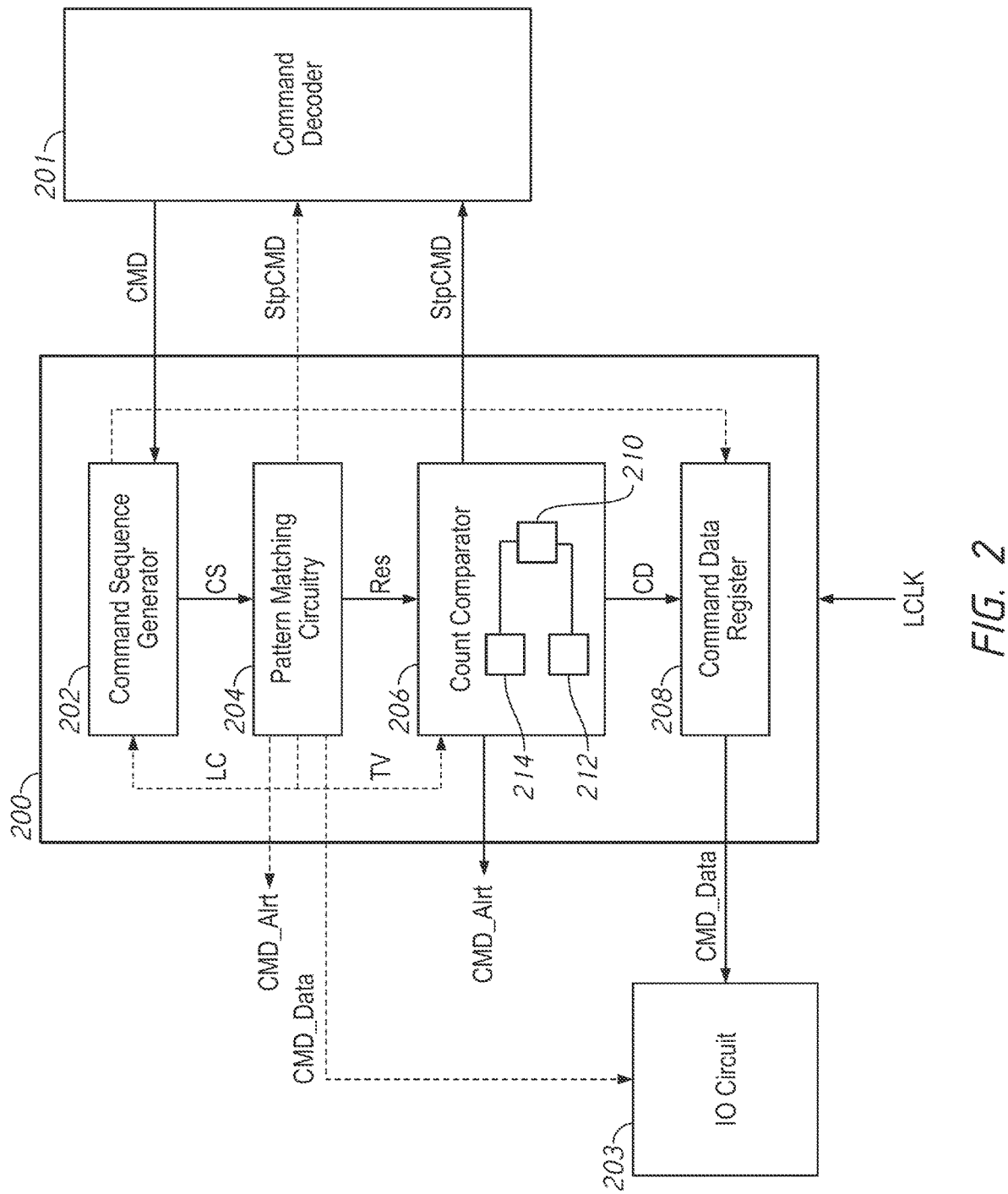
FIG. 2 is a block diagram of command/address tracking circuitry according to embodiments of the present disclosure.

FIG. 2 is a block diagram of C/A tracking circuitry 300 according to embodiments of the present disclosure. For context, an IO circuit 203 and a command decoder 201 are also shown. In some embodiments, C/A tracking circuitry 300 (also referred to as tracking circuitry) may be included in C/A tracking circuitry 130. IO circuit 203 may be included in IO circuit 122 and command decoder 201 may be included in command decoder 106. The tracking circuitry 300 may include a command sequence generator 202, pattern matching circuitry 204, a count comparator 206, and a command data register 208.

The command sequence generator 202 may receive commands CMD. In some embodiments, such as the one shown in FIG. 2, the command sequence generator 202 may receive commands from the command decoder 201. In some embodiments, the command sequence generator 202 may store, at least temporarily, one or more of the received commands prior to providing the commands and/or command sequences (CS) to the pattern matching circuitry 204. In some examples, the command sequence generator 202 may include one or more buffers, latches, and/or registers for storing commands and/or command sequences. For example, if command sequences of interest are three commands long, the command sequence generator 202 may buffer commands until at least three commands are received and then provide the three commands (e.g., a command sequence) to the pattern matching circuitry 204. Of course, a command sequence provided by the command sequence generator 202 may have a different number of commands (e.g., 1, 2, 4, etc.). In some embodiments, the command sequence generator 202 may provide varying lengths of command sequences (LC). For example, the command sequence generator 202 may provide single commands as well as multi-command sequences. In some embodiments, the command sequence generator 202 may be programmed and/or hardcoded with the length or lengths of command sequences to provide. In some embodiments, the command sequence generator 202 may receive the length or lengths of command sequences from the pattern matching circuitry 204.

The pattern matching circuitry 204 may receive the commands and/or command sequences from the command sequence generator 202. The pattern matching circuitry 204 may compare the received commands and/or command sequences to patterns of illegal commands and illegal command sequences. A result (Res) of the comparison may be provided to the count comparator 206. The result may include the illegal command or command sequence (if any) detected by the comparison. In some embodiments, the result may further include a count of how many times the illegal command or command sequence has been detected. The count may be a count within a time interval (e.g., 500 ms), a lifetime count, and/or a combination thereof. In some embodiments, the patterns included in the pattern matching circuitry 204 may be written to a register. In other embodiments, the patterns in the pattern matching circuitry 204 may be hardcoded (e.g., hardwired, fuse blows). In some embodiments, the patterns may provide the lengths of the sequences desired from the command sequence generator 202. As will be discussed in more detail with reference to FIG. 3, in some embodiments, the command sequence generator 202 may be included in the pattern matching circuitry 204 or the functions of the command sequence generator 202 may be implemented by components of the pattern matching circuitry 204.

In some embodiments, when certain illegal commands and/or command sequences are detected by the pattern matching circuitry 204, the pattern matching circuitry 204 may activate the command alert CMD_Alrt signal and/or the stop command StpCMD signal, which may be provided to an alert pin and the command decoder 201, respectively. For example, it may be desirable to block certain illegal commands or command sequences regardless of how many times the illegal command and/or command sequence has been received (e.g., a calibration command followed too closely by an access command).

The count comparator 206 may receive the result (Res) from the pattern matching circuitry 204. The count comparator 206 may include a comparator circuit 210 and/or other logic circuits. If the result indicates an illegal command and/or sequence was detected, the count comparator 206 may compare a number of times the illegal command and/or command sequence has been received to a threshold value. In some embodiments, the count comparator 206 may include a register 212 or other storage medium that stores the threshold value(s) for the illegal commands and/or command sequences. In some examples, the count comparator 206 may further include a register 212 or other storage medium for storing count values for keeping track of the number of times the illegal command and/or command sequence has been received. In some embodiments, the count comparator 206 receives the threshold values (TV) from the pattern matching circuitry 204. If the number of times an illegal command or command sequence has been received is equal to or greater than a threshold value, the count comparator 206 may activate the CMD_Alrt signal and/or the StpCMD signal. If the number of times is below the threshold value, count comparator 206 may update the count value but not activate CMD_Alrt and StpCMD. In some embodiments, the count comparator 206 may provide the illegal command and/or sequence and updated count value (CD) to the command data register 208.

If the result received from the pattern matching circuitry 204 indicates that no illegal command and/or sequence was detected, then the count comparator 206 may not update any count values or activate any signals.

In some embodiments, the result received from the pattern matching circuitry 204 only includes an indication of the illegal command or sequence detected by the pattern matching circuitry 204. In these embodiments, the count comparator 206 may include a counter 214 that stores a number of times an illegal command and/or sequence has been received (e.g., a count value). The counter 214 may be incremented each time the result indicates the illegal command and/or sequence has been received. In some embodiments, the result may include both an indication of the illegal command and/or sequence and the count value. That is, in these embodiments, the pattern matching circuitry 204 stores and increments the counts for each illegal command and/or sequence received.

In some embodiments, the pattern matching circuitry 204 and/or count comparator 206 may receive an internal clock signal LCLK, which may be provided from an internal clock generator, such as internal clock generator 114. The LCLK signal may be used to measure a time interval (e.g., a number of clock cycles or a number of milliseconds). In some embodiments, the count values associated with the illegal commands and/or sequences received may be reset (e.g., set to '0') after the time interval. Resetting the count values may be used when certain illegal commands and/or sequences are blocked only if the illegal commands and/or sequences are provided a number of times within the time interval. For example, refresh commands may not be blocked if they are temporally spaced sufficiently to prevent triggering a thermal runaway condition.

The command data register 208 may include one or more registers for storing data related to illegal commands and/or sequences (e.g. command data). In some embodiments, command data may include the illegal commands and/or sequences received as well as their updated count values received from the count comparator 206. In some embodiments, the command data may include when an illegal command and/or sequence was received. In some embodiments, the command data register 208 may also store command data related to all commands received, not just illegal commands. For example, the command data register 208 may receive commands CMD from the command sequence generator 202. In some embodiments, the command data register 208 may be a multipurpose register (MPR), As will be discussed in more detail with reference to FIG. 3, in some embodiments, the command data register 208 may be included in the pattern matching circuitry 204 or the functions of the command data register 208 may be implemented by components of the pattern matching circuitry 204.

The command data may be read from the command data register 208 by a MPR read command and/or a command data register read command. Responsive to a read command, the command data register 208 may provide the command data CMD_Data to IO circuit 203. The command data may allow a user, another component of a memory, and/or a device in communication with the C/A tracking circuitry 300 to analyze use of the memory. For example, the command data may be analyzed to determine which attacks are most commonly, attempted. In another example, the command data may be analyzed after a memory failure to determine if there are additional illegal commands or sequences that should be provided to the pattern matching circuitry 204. In some embodiments, the command data may be provided whenever the StpCMD and/or CMD_Alrt signals are activated. The command data may be used to provide information as to what illegal command and/or command sequence has been detected, blocked, and/or modified.

Figure 3:
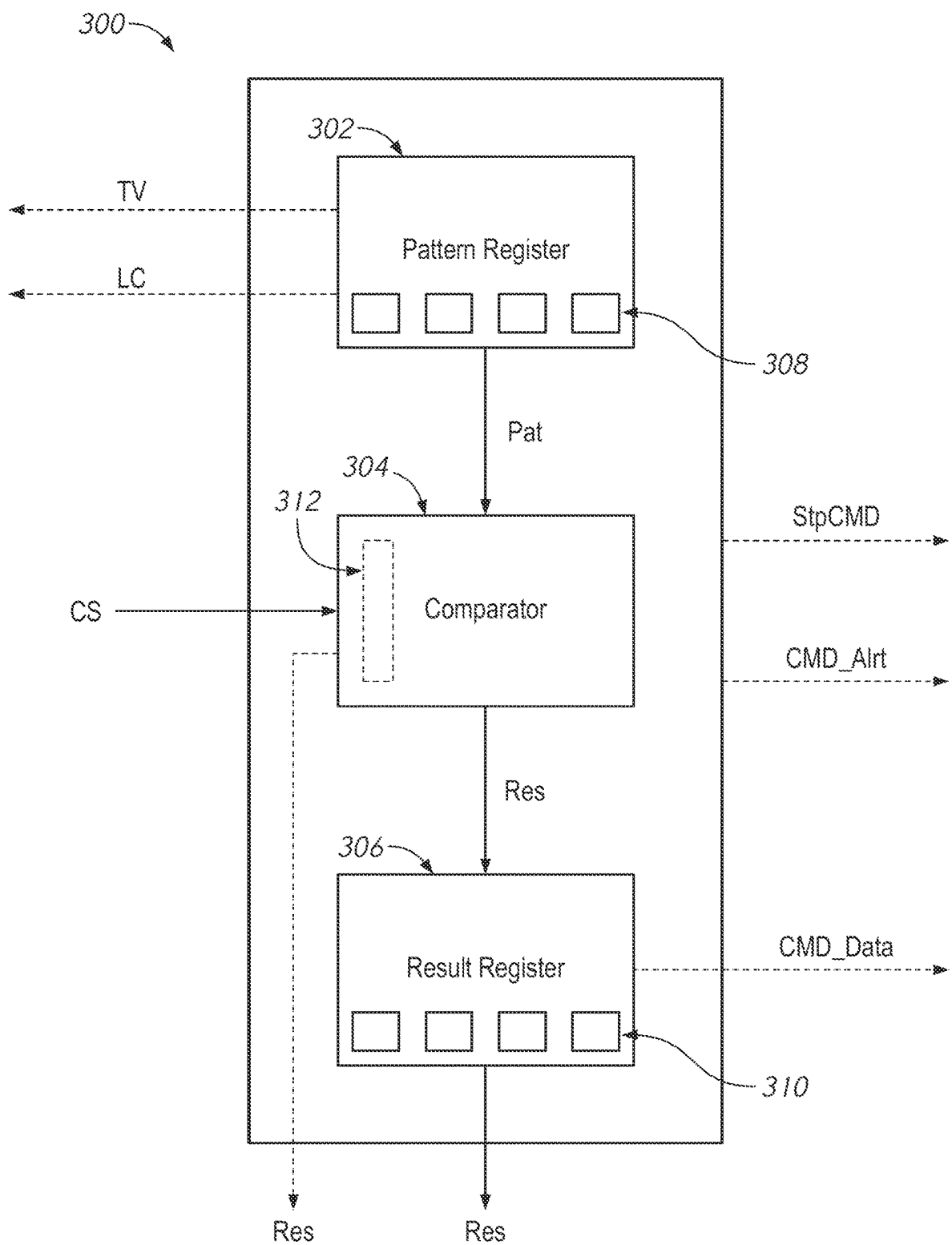
FIG. 3 is a block diagram of pattern matching circuitry according to embodiments of the present disclosure.

FIG. 3 is a block diagram of pattern matching circuitry 300 according to embodiments of the present disclosure. In some embodiments, pattern matching circuitry 300 may be included in pattern matching circuitry 204. The pattern matching circuitry 300 may include a pattern register 302, a comparator 304, and a result register 306.

The pattern matching circuitry 300 may receive data, which may be provided to the pattern register 302 and/or comparator 304. The data may be provided from a memory array, such as memory array 118 and/or an IO circuit such as IO circuit 122 and/or IO circuit 203.

The pattern register 302 may store one or more patterns to be used in a pattern matching operation. In some embodiments, the pattern register 302 may include multiple registers 308. Each register 308 may store one or more patterns. In some embodiments, the pattern register 302 may be implemented using a multipurpose register (MPR). In these embodiments, a pattern may be written to the pattern register 302 using an MPR write command. In other embodiments, a pattern may be written to the pattern register 302 responsive to a pattern register write command. In some embodiments, pattern register 302 may also store additional data, such as threshold values associated with each pattern and/or lengths of each pattern. In some embodiments, the threshold values TV and/or lengths of each pattern LC, may be provided to other components in communication with the pattern matching circuitry 300 (e.g., command sequence generator 202). In some embodiments, some or all of the patterns may be hardcoded (e.g., hardwired, fuse blows) in the pattern register 302. For example, patterns corresponding to illegal commands and/or illegal command sequences and/or other data relating to illegal commands and/or command sequences may be hardcoded in the pattern register 302.

The comparator 304 may receive the pattern Pat from the pattern register 302 and a command and/or command sequence CS. In some embodiments, CS may be received from a command sequence generator, such as command sequence generator 202. The comparator 304 may perform a pattern matching operation to determine if CS includes Pat. In some embodiments, the comparator 304 may perform pattern matching operations for multiple patterns Pat, for example, when pattern register 302 includes more than one pattern. The pattern matching operations on multiple patterns may be performed sequentially or in parallel. Based on the determination of the pattern matching operation, the comparator 304 may generate a result Res. In some embodiments, Res may include a count value of a number of times Pat is present in the CS, which Pat of multiple patterns was found in CS, and/or a combination thereof. For example, Res may include an indication of an illegal command and/or sequence found in CS and/or a number of times the illegal command and/or sequence has been found. In some embodiments, the pattern matching circuitry 300 may activate a stop command signal StpCMD and/or a command alert signal CMD_Alrt responsive to the pattern matching operation performed by the comparator 304 determining that an illegal command and/or sequence is present in CS.

In some embodiments, the comparator 304 may include comparator logic such as a plurality of XOR logic circuits. The number of logic circuits may be based, at least in part, on a length (e.g., number of bits) in the pattern to be matched. In some embodiments, the comparator 304 may include one or more content addressable memory (CAM) cells. Other logic circuits or other circuit components (e.g., operational amplifiers) may be included in the comparator 304 in some embodiments.

In some embodiments, the comparator 304 may include a buffer 312, The buffer 312 may temporarily store one or more commands received until a desired sequence length has been acquired. In these embodiments, the comparator 304 may receive commands from a command decoder (e.g., command decoder 106, command decoder 201) rather than, or in addition to, receiving CS from a command sequence generator. Thus, in some embodiments, the command sequence generator may be omitted.

The result register 306 may store one or more results Res output by the comparator 304 responsive to the pattern matching operation, in some embodiments, the result register 306 may include multiple registers 310. Each register 310 may store one or more results. In some embodiments, the result register 306 may include a multipurpose register (MPR). In these embodiments, a result register 306 may be read using an MPR read command. In other embodiments, a result may be read from the result register 306 responsive to a result register read command. In some embodiments, the result may be provided to a count comparator such as count comparator 206. Optionally, in some embodiments, the comparator 304 may provide the Res to the count comparator in addition to or instead of the result register 306.

In some embodiments, the result register 306 may provide the result to an IO circuit, such as IO circuit 122. In some embodiments, the result register 306 may provide the result to a command data register, such as command data register 208. In some embodiments, the result register 306 may store command data related to illegal commands and/or sequences or all commands and/or sequences and provide CMD_Data to the IO circuit. In these embodiments, the command data register may be omitted.

Figure 4:
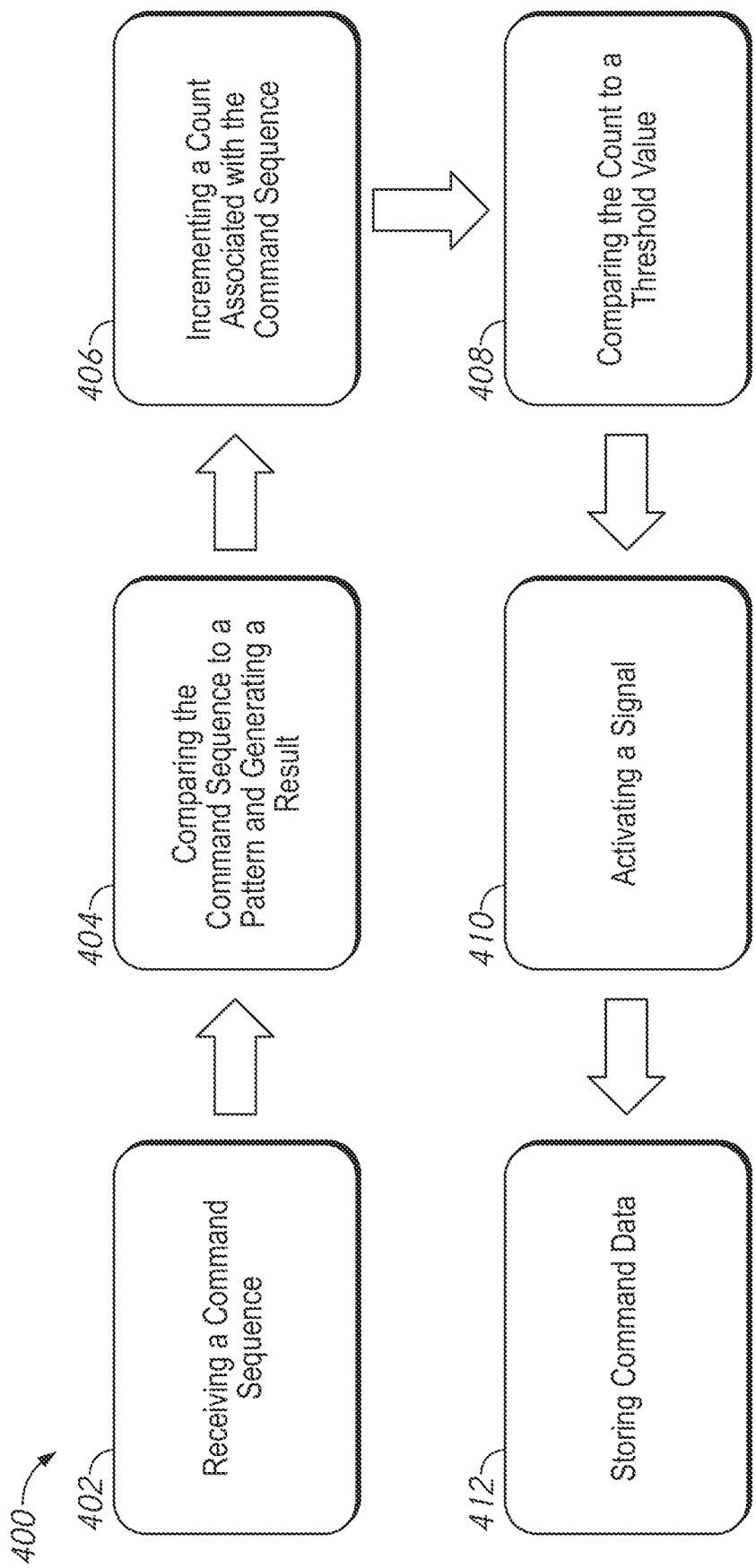
FIG. 4 is a flow chart of a method according to embodiments of the present disclosure.

FIG. 4 is a flow chart of a method 400 according to embodiments of the present disclosure. In some embodiments, some or all of the method 400 may be performed by the tracking circuitry 130, the tracking circuitry 200, and/or pattern matching circuitry 300.

At block 402, "receiving a command sequence," may be performed. The command sequence may include at least one command, in some embodiments, the command sequence may be received by a command sequence generator, such as command sequence generator 202. In some embodiments, the command sequence may be received by a buffer, such as buffer 312, of pattern matching circuitry, such as pattern matching circuitry 204 and/or pattern matching circuitry 300.

At block 404, "comparing the command sequence to a pattern and generating a result" may be performed. The comparing may be performed by pattern matching circuitry. In some embodiments, the comparing may be performed by a comparator of the pattern matching circuitry, such as comparator 304. In some embodiments, the pattern may correspond to an illegal command sequence including at least one illegal command.

When the result indicates the command sequence includes the pattern, at block 406, "incrementing a count associated with the command sequence" may be performed and at block 408 "comparing the count to a threshold value" may be performed. The incrementing and comparing may be performed by a count comparator, such count comparator 206. If the result indicates the command sequence does not include the pattern, the method 400 may end after block 404 and blocks 406 and 408 may not be performed.

When the count is equal to or greater than the threshold value, at block 410, "activating a signal" may be performed. In some embodiments, the signal may prevent execution of the command sequence. For example, the signal may cause a command decoder, such as command decoder 106 to prevent execution and/or modify the command sequence. If the result indicates the count is not equal or greater than the threshold value, method 400 may end after block 408 and block 410 may not be performed.

Optionally, in some embodiments, at block 412, "storing command data" may be performed. The command data may be associated with the command sequence. In some embodiments, the command data may be stored in a register, such as command data register 208. In some embodiments, block 412 may be performed even if blocks 406 and 408 and/or block 410 are not performed. In some embodiments, the command data may be provided from the register responsive to a register read command.

Figure 5:
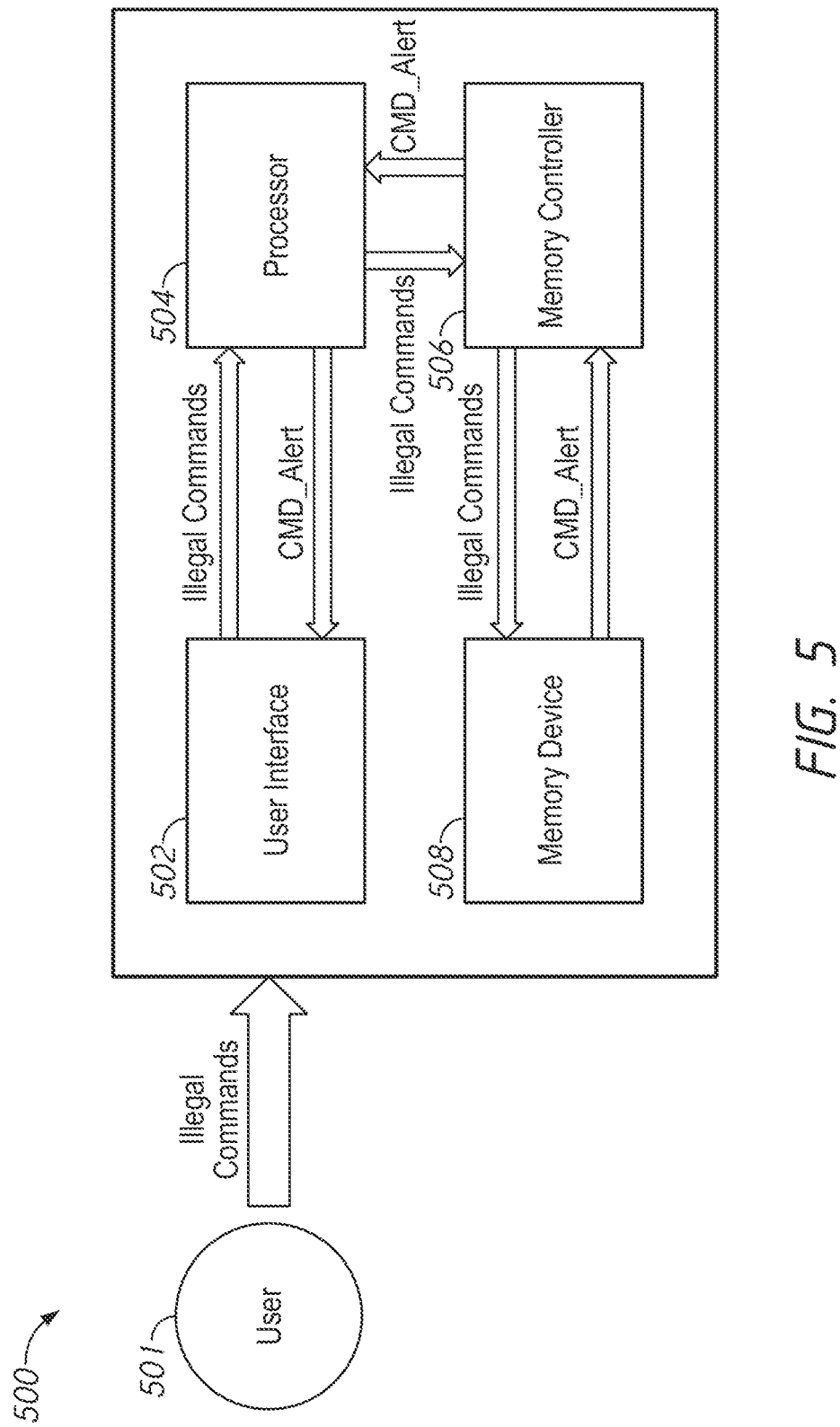
FIG. 5 is a block diagram of a computing system including a memory device according to embodiments of the present disclosure.

FIG. 5 is a block diagram of a computing system 500 including a memory device 508 according to embodiments of the present disclosure. The computing system 500 may include a user interface 502, a processor 504, a memory controller 506, and a memory device 508.

The user interface 502 may include one or more components that receive input from a user 501 and/or provide output (e.g., text, graphics, sound) to the user 501. Example components include, but are not limited to, a keyboard, a mouse, a touchscreen, a display (e.g., liquid crystal display), a speaker, and a microphone. The processor 504 may include one or more processing units that perform computational operations. The processor 504 may be a multicore and/or multithread processor in some embodiments. The processor 504 may perform computational operations based, at least in part, on inputs received by the user interface 502 from the user 501.

The memory controller 506 may provide an interface between the processor 504 and the memory device 508. The memory controller 506 may receive commands from the processor 504, for example, requests to retrieve for and/or store data from computational operations performed by the processor 504. The memory controller 506 may translate the commands from the processor 504 into memory commands executable by the memory device 508. The memory controller 506 may further provide data from the processor 504 in a manner in which the memory device 508 may store the data (e.g., in a memory array included in the memory device 508). The memory controller 506 may receive data requested by the processor 504 from the memory device 508 and/or other information from the memory device 508. The memory controller 506 may provide the data to the processor 504.

In some embodiments, the memory device 508 may include device 100 shown in FIG. 1. In some embodiments, the memory device 508 may include tracking circuitry 130 shown in FIG. 1 and/or tracking circuitry 200 shown in FIG. 2. The tracking circuitry may be used to detect and/or prevent the execution of illegal commands and/or sequences (for brevity, both illegal individual commands and sequences of commands will be referred to as illegal commands).

In the example shown in FIG. 5, the user 501 may provide illegal commands to the computing device 500. The user 501 may be another device or a person interacting with the computing device 500. The user 501 may be a user that is not permitted to access the computing system 500 or a portion thereof. However, the user 501 may be a legitimate user of the computing system 500 that has inadvertently caused illegal commands to be issued. For example, the user 501 may have misread the memory device 508 specifications and provided an inadequate latency between commands or programmed a defective loop that causes too many commands to be issued. Regardless of the intent of the user 501, in some embodiments, the illegal commands may be provided to the user interface 502. In other embodiments, the user 501 may bypass the user interface 502 and provide illegal commands directly to the processor 504, memory controller 506, and/or memory device 508. The illegal commands may be provided to the memory device 508 (e.g., directly or via the user interface 502, processor 504, and/or memory controller 506).

In some embodiments, the illegal commands may be received by a command decoder of the memory device 508, such as command decoder 106 and/or command decoder 201. The commands may be provided to the tracking circuitry of the memory device 508. The illegal commands may be detected by the tracking circuitry, for example, by pattern matching circuitry, such as pattern matching circuitry 204 and/or pattern matching circuitry 300 and/or a count comparator, such as count comparator 206. Responsive to detecting the illegal commands, the tracking circuitry may prevent the command decoder from causing the illegal commands to be executed by the memory device 508. In some embodiments, the command decoder may modify the illegal commands. The tracking circuitry may further issue a command alert signal (CMD_Alert), The command alert signal may include data that indicates that the illegal commands were detected, not executed, and/or modified. The command alert signal may be provided to the memory controller 506. In some embodiments, the command alert signal may be provided from the memory controller 506 to the processor 504, which, in some embodiments, may provide the command alert signal to the user interface 502. The user interface 502 may provide the command alert signal to the user 501 in some embodiments. In some embodiments, responsive to the command alert signal, the processor 504 and/or user interface 502 may be configured to restrict access to the computing system 500. For example, the user interface 502 may refuse to accept further input from the user 501 until a password or other authentication is received. In another example, the processor 504 may cease performing computational operations for a period of time and/or until an "all clear" signal is received from the user interface 502. The system 500 may take other actions responsive to the command alert signal and the embodiments of the disclosure are not limited to the two preceding examples.

The apparatuses and methods disclosed herein may allow for detection of illegal commands and/or command sequences in some embodiments. In some embodiments, the apparatuses and methods disclosure herein may prevent the execution of illegal commands and/or command sequences. In some embodiments, the apparatuses and methods disclosed herein may allow for modification of the illegal commands and/or command sequences. In some embodiments, the apparatuses and methods disclosed herein may allow for notification of the receipt of illegal commands and/or command sequences and/or allow for command data to be provided. The apparatuses and methods disclosed herein may prevent damage to memory devices due to the execution of illegal commands and/or command sequences in some applications. Although the examples provided herein refer to DRAM, the principles of the present disclosure are not limited to a particular memory type.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. An apparatus comprising:
   a command sequence generator configured to receive and store memory commands and provide a command sequence including at least one memory command;
   pattern matching circuitry configured to receive the command sequence and compare the command sequence to a pattern and generate a result, wherein the result indicates whether or not the pattern is included in the command sequence, wherein the pattern corresponds to one or more memory commands, wherein the pattern matching circuitry comprises a pattern register configured to store the pattern and a first comparator configured to compare the command sequence to the pattern and generate the result;
a count comparator comprising a second comparator and a counter, the count comparator configured to receive the result, and when the result indicates the pattern is included in the command sequence, the count comparator is further configured to update a count value associated with the command sequence including the pattern and compare the count value to a threshold value; and
a command data register configured to store command data associated with the command sequence including the pattern, wherein the command data register is configured to provide the command data to an IO circuit of a memory device responsive to a register read command received from a memory controller, wherein the command data comprises a number of times a command was received, a number of times within a first time interval a command was received, when a command was received, or a combination thereof.

2. The apparatus of claim 1, wherein the count comparator is further configured to reset the count value after a second time interval.

3. The apparatus of claim 2, wherein the second time interval is based, at least in part, on a clock signal.

4. The apparatus of claim 1, wherein the pattern matching circuitry further includes a result register configured to store the result.

5. The apparatus of claim 1, wherein the pattern register is further configured to store the threshold value and provide the threshold value to the count comparator.

6. The apparatus of claim 1, wherein the pattern register is further configured to store a number of commands to in the command sequence and provide the number of commands to the command sequence generator.

7. The apparatus of claim 1, wherein the memory device comprises a dynamic random access memory (DRAM) device.

8. A memory comprising:
a command decoder configured to decode commands received from a memory controller;
tracking circuitry, comprising one or more circuits, configured to receive the commands and analyze the commands to determine if the commands include at least one of an illegal command or illegal command sequence, wherein when the circuitry determines the commands include at least one of the illegal command or the illegal command sequence, the circuitry is further configured to provide an active stop command signal to the command decoder, wherein the command decoder is configured to prevent execution of the illegal command or command sequence responsive to the active stop command signal; and
an IO circuit, wherein the tracking circuitry is configured to provide command data associated with the commands to the IO circuit, wherein the command data comprises a number of times a command was received, a number of times within a time interval a command was received, when a command was received, or a combination thereof.

9. The memory of claim 8, wherein when the tracking circuitry determines the commands include at least one of the illegal command or the illegal command sequence, the tracking circuitry is further configured to provide an active command alert signal to an alert pin of the memory.

10. The memory of claim 8, wherein the command data is provided to the IO circuit responsive to a register read command received from a memory controller.

11. The memory of claim 8, wherein the command data is provided to the IO circuit responsive to determining the commands include at least one of the illegal command or the illegal command sequence.

12. The memory of claim 8, further comprising an internal clock generator configured to provide a clock signal to the tracking circuitry, wherein determining if the commands include the at least one of the illegal command or the illegal command sequence is based, at least in part, on the clock signal.

13. The memory of claim 8,
wherein the command decoder is configured to prevent execution of the illegal command or command sequence by modifying the illegal command or command sequence.

14. The memory of claim 8, wherein the IO circuit is configured to provide command data associated with the commands to the memory controller.

15. A method comprising:
receiving from a memory controller a command sequence including at least one command at tracking circuitry of a memory device;
comparing, with the tracking circuitry, the command sequence to a pattern that corresponds to an illegal command sequence including at least one illegal command;
incrementing a count associated with the command sequence and comparing the count to a threshold value when a result indicates the command sequence includes the pattern;
issuing, from the tracking circuitry, a signal configured to prevent execution of the command sequence when the count is equal to or greater than the threshold value;
storing command data associated with the command sequence in a register of the tracking circuitry, wherein the command data comprises a number of times a command was received, a number of times within a time interval a command was received, when a command was received, or a combination thereof;
receiving a read register command; and
providing the command data from the tracking circuitry to an IO circuit of the memory device responsive to the read register command.

16. The method of claim 15, further comprising providing the command data to the memory controller from the IO circuit.

* * * * *